(12) United States Patent
Zhu et al.

(10) Patent No.: US 7,081,781 B2
(45) Date of Patent: Jul. 25, 2006

(54) CHARGE PUMP FOR A LOW-VOLTAGE WIDE-TUNING RANGE PHASE-LOCKED LOOP

(75) Inventors: Xiang Zhu, San Jose, CA (US); Ming Qu, San Jose, CA (US); Yongmin Ge, Sunnyvale, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 89 days.

(21) Appl. No.: 10/817,215

(22) Filed: Apr. 2, 2004

(65) Prior Publication Data

US 2005/0218948 A1 Oct. 6, 2005

(51) Int. Cl.
*H03L 7/06* (2006.01)

(52) U.S. Cl. ...................................... 327/157
(58) Field of Classification Search ................ 327/148, 327/157
See application file for complete search history.

(56) References Cited

U.S. PATENT DOCUMENTS

| | | | |
|---|---|---|---|
| 6,275,097 B1 * | 8/2001 | Liang et al. ................ | 327/536 |
| 6,292,061 B1 * | 9/2001 | Qu ............................... | 331/17 |
| 6,498,538 B1 | 12/2002 | Qu et al. ...................... | 331/25 |
| 6,686,794 B1 * | 2/2004 | Abidin et al. ................ | 327/537 |
| 2005/0024112 A1 * | 2/2005 | Keaveney .................... | 327/172 |

OTHER PUBLICATIONS

ISSCC 2003/Session 24/Clock Generation/Paper 24.1, 2003 IEEE International Solid-State Circuits Conference.
"Differential CMOS Circuits for 622-MHz/933-MHz Clock And Data Recovery Applications," by Hormoz Djahanshahi et al., IEEE Journal of Solid-State Circuits, vol. 35, No. 6, Jun. 2000.

* cited by examiner

*Primary Examiner*—Quan Tra
(74) *Attorney, Agent, or Firm*—MacPherson Kwok Chen & Heid LLP; Jonathan W. Hallman

(57) ABSTRACT

A charge pump for a differential phase-locked loop (PLL) is provided. The charge pump includes a current switch configured to voltage to source and sink a current in a complementary fashion from a pair of differential output nodes. The charge pump includes a common-mode feedback loop to maintain the charging and discharging of the differential output nodes with respect to a common-mode voltage. Transconductance amplifiers are provided within the common-mode feedback loop to provide greater dynamic range to the charging and discharging of the differential output nodes.

5 Claims, 3 Drawing Sheets

CHARGE PUMP FOR A LOW-VOLTAGE WIDE-TUNING RANGE PHASE-LOCKED LOOP

TECHNICAL FIELD

The present invention relates generally to phase-locked loops, and more particularly to a charge pump configured for use in a low-voltage wide-tuning range phase-locked loop.

BACKGROUND

Phase-locked loops (PLLs) are often used as clock regenerators or frequency synthesizers in digital systems. For example, PLLs are used in a wide variety of applications in areas such as communication devices and other types of digital electronics. PLLs can be designed to operate in either a single-ended or differential fashion. As compared to a single-ended phase-locked loop (PLL), a differential PLL provides greater immunity to substrate noise, power supply or ground voltage fluctuations, and other undesirable effects. Despite the advantages provided by a differential PLL, problems arise in their design for low-power-supply-voltages such as a sub one-volt (1 V) power supply.

These problems may be further explained with respect to a conventional differential PLL 100 as illustrated in FIG. 1. Differential PLL 100 adjusts the output frequency and/or phase of a clock signal 110 synthesized by a voltage-controlled oscillator (VCO) 120 so as to match a reference clock signal (Refclk) 130. The VCO-produced clock signal 110 loops back as a feedback signal through a loop divider 140 that translates the frequency of the clock signal 110 to become a VCO-divided signal 105. A phase detector 150 then compares the phases of VCO divided signal 105 and the reference clock signal. Based upon this comparison, the phase detector adjusts the pulse widths for differential up and down voltages. The differential up voltage is comprised of an up positive voltage (upp) and an up negative voltage (upn). Similarly, the differential down voltage is comprised of a down positive voltage (dnp) and a down negative voltage (dnn). A conventional charge pump 160 adjusts a differential control voltage (formed from VCTP and VCTN) according to the relative pulse widths for the differential up and down voltages. A loop filter 170 then filters the differential control voltage using capacitive loads before the differential control voltage is received by the VCO, which then adjusts the clock signal accordingly.

As known in the art, the VCTP and VCTN voltages (which together form the differential control voltage) produced by the charge pump will vary with respect to a common mode voltage. Depending upon the necessary control of the clock signal, VCTP will vary from the common mode voltage whereas VCTN will vary in a complementary fashion from the common mode voltage. In other words, if VCTP increases from the common-mode voltage in response to the differential up voltage having a greater pulse width than the differential down voltage, VCTN will decrease the same amount from the common-mode voltage. Alternatively, if VCTN increases from the common-mode voltage in response to the differential down voltage having a greater pulse width than the differential up voltage, VCTP will decrease the same amount from the common-mode voltage. To maintain the common mode voltage for both signals, the charge pump will typically possess a common-mode feedback loop comprised of differential transistor pairs (not illustrated). But as a supply voltage (not illustrated) for differential PLL 100 is decreased, the available dynamic range for VCTP and VCTN will decrease accordingly. For example, suppose the supply voltage is 1 V. Such a value for the supply voltage leaves a maximum of 1 V of dynamic range for both VCTP and VCTN. However, this dynamic range cannot be fully exploited because the differential transistor pairs used in the feedback loop to maintain the common mode voltage cannot be driven "rail-to-rail," i.e., between ground and the supply voltage. In such a case, neither VCTP nor VCTN could be varied through the full 1 V available dynamic range. Instead, a more limited dynamic range would have to be used to keep the differential transistor pairs in the common-mode feedback loop operating correctly. This limited dynamic range may not be enough to keep differential PLL 100 within the proper operating range.

Thus, there is a need in the art for improved differential PLL designs for use with low power supply voltages.

SUMMARY

In accordance with one aspect of the invention, a differential charge pump is provided. The charge pump includes: a current switch responsive to a pulse width difference between a differential up voltage and a differential down voltage to source and sink a current in a complementary fashion from a pair of differential output nodes, a first transconductance amplifier configured to convert a voltage at a first one of the differential output nodes into a first current; and a second transconductance amplifier configured to convert a voltage a second one of the differential output nodes into a second current that is the opposite of the first current.

In accordance with another aspect of the invention, a differential phase-locked loop (PLL) is provided. The differential PLL includes: a phase detector configured to compare a feedback signal to a reference signal to produce a differential up voltage and a differential down voltage; and a charge pump responsive to a pulse width difference between the differential up voltage and the differential down voltage to source and sink a current in a complementary fashion from a pair of differential output nodes, the charge pump including a common-mode feedback circuit configured so-that the differential output nodes charge and discharge with respect to a common mode voltage, wherein the common-mode feedback circuit is isolated from the differential output nodes through transconductance amplifiers.

In accordance with another aspect of the invention, a method of operating a differential charge pump is provided. The method includes the acts of: comparing the pulse widths of a differential up voltage and a differential down voltage node; generating a positive differential control voltage at a first differential output node and a negative differential control voltage at a second differential output node responsive to the pulse width comparison; converting the positive differential control voltage into a first current using a first transconductance amplifier; and converting the second differential control voltage into a second current using a second transconductance amplifier.

BRIEF DESCRIPTION OF THE DRAWINGS

Use of the same reference symbols in different figures indicates similar or identical items.

DETAILED DESCRIPTION

Figure 2:
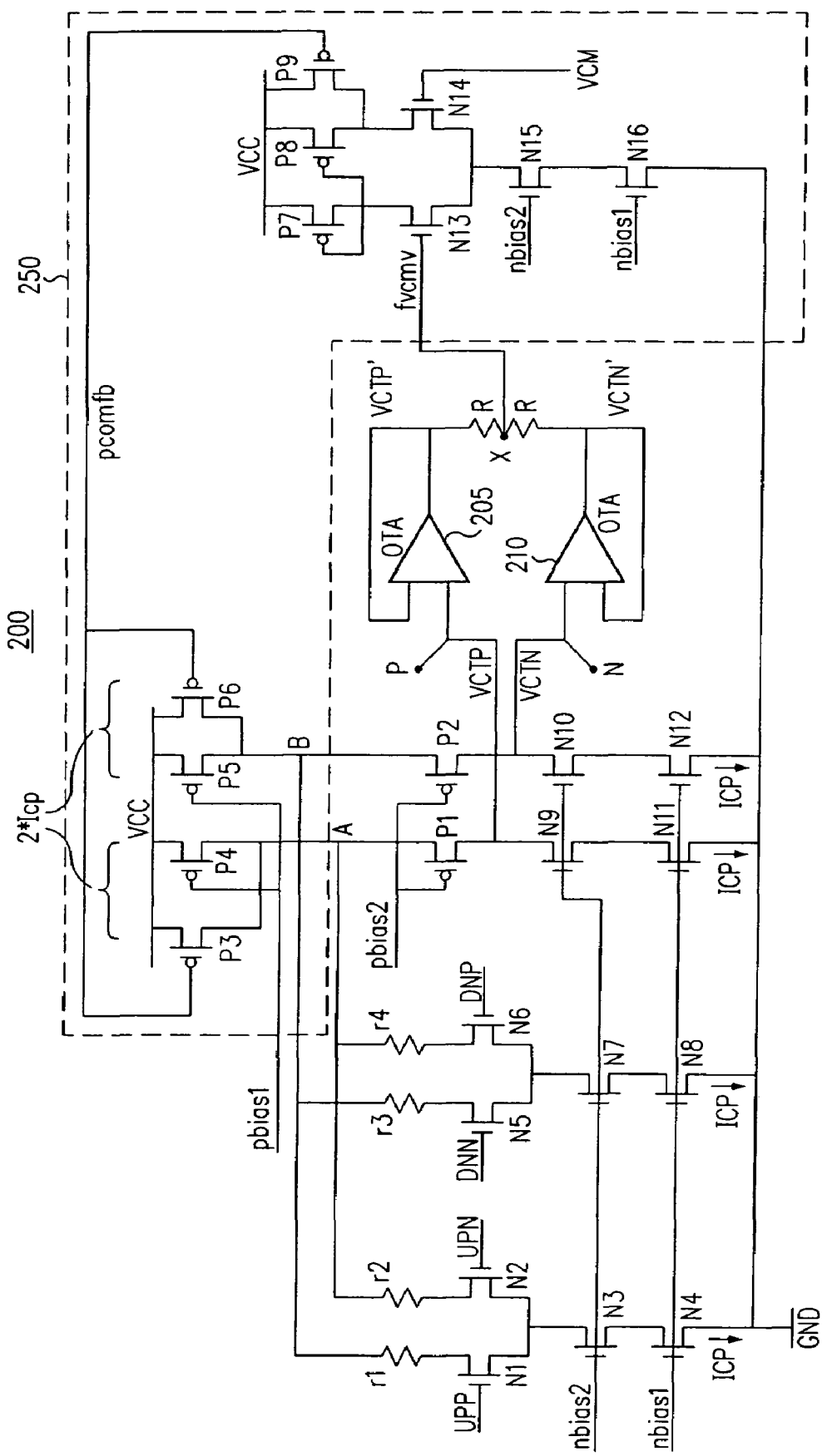
FIG. 2 is a schematic illustration of a charge pump according to one embodiment of the invention.

As discussed previously, the proper operation of the charge pump in a differential PLL is critical to prevent jitter and other undesirable effects at lower supply voltage values. Turning now to FIG. 2, an exemplary embodiment of an improved charge pump 200 for proper differential PLL operation is illustrated. Charge pump 200 includes four pairs of series connected NMOS transistors: transistor pair N3/N4, transistor pair N7/N8, transistor pair N9/N11, and transistor pair N10/N12. Each transistor pair is matched to the others and is biased by the same bias voltages nbias2 and nbias1 such that each transistor pair acts as a current source that sinks a current Icp.

The current sources formed transistor pairs N3/N4 and N7/N8 bias differential NMOS transistor pairs N1/N2 and N5/N6, respectively. Thus, each differential pair will conduct a current Icp. This current will be conducted virtually entirely by one transistor or another within each differential pair depending upon the relative values of the differential voltages biasing the transistor gates. For example, the differential up voltage comprised of an up positive component and an up negative (UPN) component biases the gates of transistors N1 and N2, respectively. Similarly, a differential down voltage comprised of a differential down positive (DNP) component and a differential down negative (DNN) component biases the gates of transistors N6 and N5, respectively. The current switching performed by each differential pair may be further explained with respect to F*igure* 3, which illustrates the up and down differential voltage waveforms.

As known in the art, the up positive and up negative voltages are complementary to one another with respect to the common mode voltage, $V_{CM}$.

Figure 1:
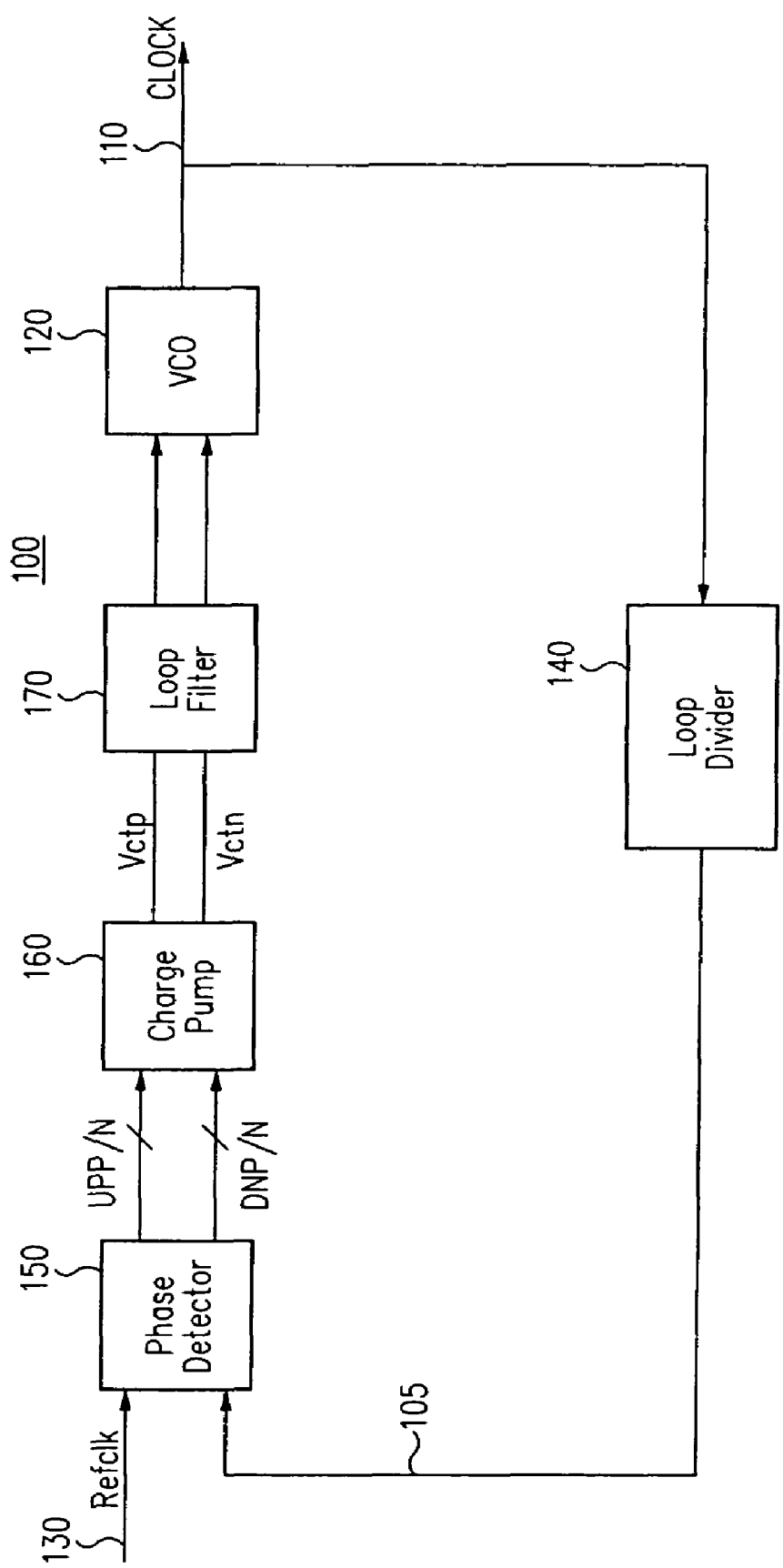
FIG. 1 is a block diagram of a conventional differential PLL and a differential PLL including a charge pump in accordance with an embodiment of the invention.
Figure 3:
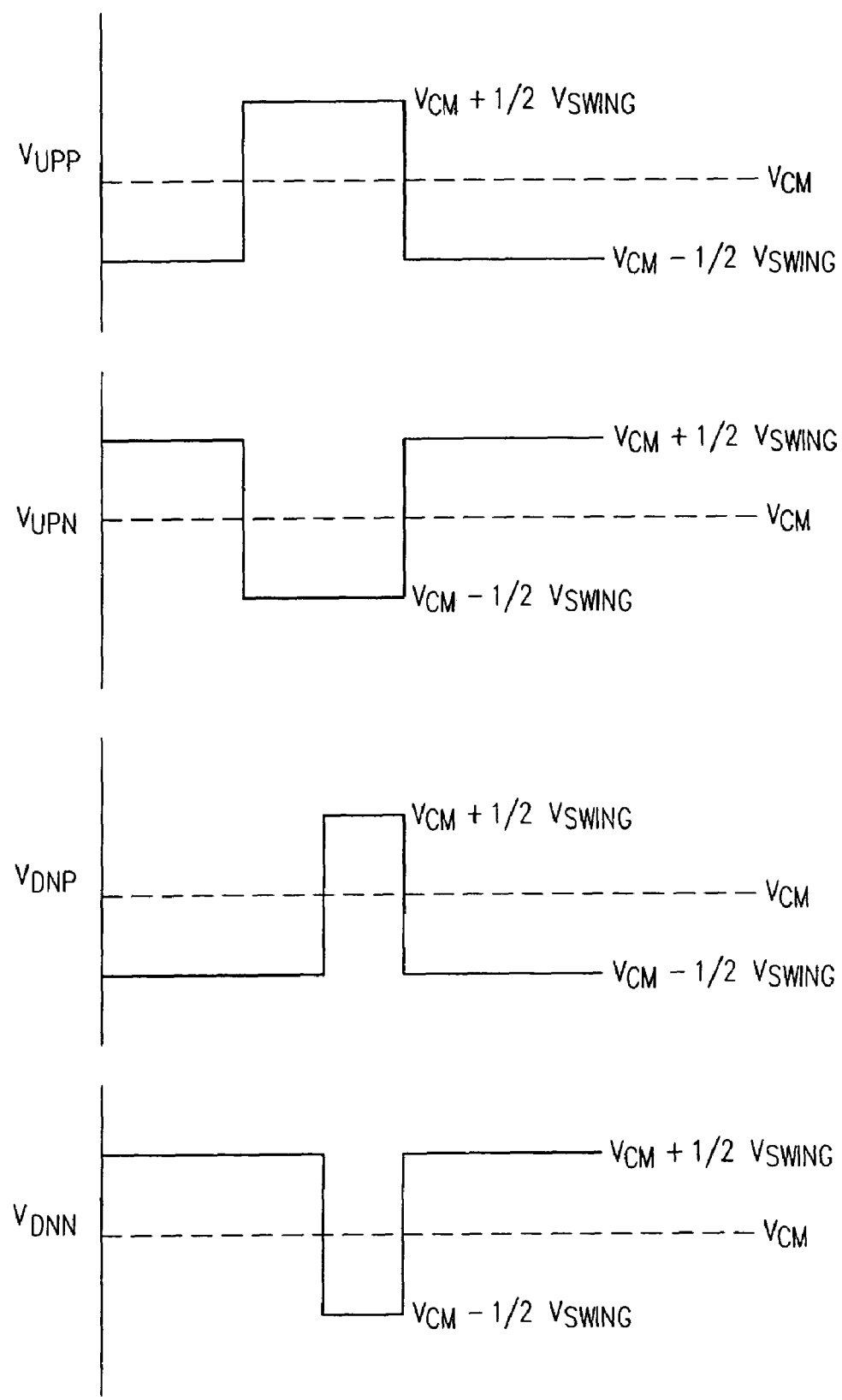
FIG. 3 is a plot of the differential up and down voltage waveforms used as inputs to the charge pump of FIG. 2.

Each has a dynamic range denoted as Vswing. In its default state, the up positive voltage ($V_{UPP}$) equals the common mode voltage minus ½ the swing voltage whereas the default state for the up negative voltage ($V_{UPN}$) equals the common mode voltage plus ½ the swing voltage. When the up positive voltage is pulsed it increases to the common mode voltage plus ½ the swing voltage. At the same time, the up negative voltage will drop to the common mode voltage minus ½ the swing voltage. The down positive voltage ($V_{DNP}$) and the down negative voltage ($V_{DNN}$) are pulsed analogously. Thus, the default state for the down positive voltage equals the common mode voltage minus ½ the swing voltage. Similarly, the default state for the down negative voltage equals the common mode voltage plus ½ the swing voltage. When the down positive voltage is pulsed it increases to the common mode voltage plus ½ the swing voltage. At the same time, the down negative voltage decreases to the common mode voltage minus ½ the swing voltage. Note that a pulse edge for the differential voltages should be aligned for both the up and down differential voltages. It is customary to have the falling edge aligned as shown in FIG. 3 but this alignment could also be performed with respect to the rising edge. For successive pulse cycles in the up and down differential voltages, the relative pulse widths are changed depending upon the necessary modulation needed to drive the VCO (FIG. 1).

Referring back to FIG. 2, it may be seen that until the differential up voltage is pulsed, the current Icp will be virtually entirely conducted by transistor N2. During the time the differential up voltage is pulsed, the current Icp will be virtually entirely conducted by transistor N1. Similarly, until the differential down voltage is pulsed, the current Icp will be virtually entirely conducted by transistor N5. During the time the differential down voltage is pulsed, the current Icp will be conducted by transistor N6.

The resulting current steering from these differential pairs of transistors will affect the differential control voltage as follows. The control voltage positive component (VCTP) of the differential control voltage is provided at the drain of a PMOS transistor P1 whereas the control voltage negative component (VCTN) is provided at the drain of a PMOS transistor P2. The sources of transistors P1 and P2 connect to nodes A and B, respectively. Transistor P1 is biased by the current source formed from transistors N9/N11. Thus, if a current greater than Icp flows into the source of transistor P1, the excess over Icp flows through a differential output node P to charge a capacitive load within the loop filter (not illustrated but discussed with respect to FIG. 1). Similarly, transistor P2 is biased by the current source formed from transistors N10/N11. Therefore, if a current greater than Icp flows into the source of transistor P2, the excess over Icp will flow through a differential output node N to charge a capacitive load within the loop filter. Because this is a differential mode device, if node P is sinking current to the loop filter, an equal current will be sourced at node N. Conversely, if node N is sinking current, an equal current will be sourced from the loop filter at node P.

It may be seen that regardless of whether the differential up and down voltages are in their default states or are pulsed, nodes A and B will each supply a current of 2*Icp. A differential pair of PMOS transistors P5/P6 provides the current of 2*Icp to node B whereas a differential pair of PMOS transistors P3/P4 provides the current of 2*Icp to node A. Differential pairs P3/P4 and P5/P6 form part of a common-mode feedback loop 250 as will be explained further herein. Node A supplies the current into a drain of transistor N2. Thus, in the default state for the up differential voltage, the 2*Icp current provided by differential pair P3/P4 will be split equally between transistors N2 and P1. However, when the differential up voltage is pulsed, transistor N2 is no longer conducting. Assuming that the differential up pulse width is greater than the differential down pulse width as shown in FIG. 3, Transistor P1 will thus carry a current of 2*Icp. But because transistor pair N9/N11 will only drain a current of Icp from transistor P1, a current of Icp will thus charge the capacitive load in the loop filter coupled to node P, thereby increasing VCTP. At the same time, the 2*Icp current provided by differential pair P5/P6 will be split equally between transistors N1 and N5. Thus, transistor P2 will be conducting no current. However, the current source formed by transistors N10 and N12 is still sinking a current of Icp, which must be provided by the capacitive load in the loop filter that couples to node N, thereby decreasing VCTN in a complementary fashion to the increase in VCTP. When the differential down voltage is pulsed, transistor N6 becomes conductive so that the excess current over Icp that was conducted into transistor P1 is diverted. At the same time, transistor N5 is no longer conducting such that node N no longer sources current from the capacitive load in the loop filter. Because of the capacitive loads in the loop filter that couple to nodes P and N, the changes in VCTP and VCTN will be maintained until the next up/down pulsing cycle.

Should the differential down pulse width be greater than the differential up pulse width, an analogous operation occurs with respect to voltage VCTN. In the default state, transistor N5 is conducting such that the current 2*Icp flowing into node B from differential transistor pair P5/P6 is split equally between transistor P2 and transistor N5. However, when the differential down voltage is pulsed, transistor N5 will no longer be conducting. Transistor P2 will thus conduct a current of 2*Icp whereas transistor pair N10/N12 can only drain a current of Icp. The excess current Icp will thus charge the capacitive load in the loop filter coupled to node N, thereby increasing VCTN. At the same time, transistor N2 is conducting so that the current 2*Icp provided by the differential pair P3/P4 will be split equally between transistors N6 and N2. Transistor P1 will thus be conducting no current. However, the current source formed by transistors N9 and N11 will still be sinking a current Icp that will be sourced from node P, thereby decreasing VCTP in a complementary fashion to the increase in VCTN. When the differential up voltage is finally pulsed, transistor N1 will conduct so that the excess current through transistor P2 will be diverted, stopping any further increases in VCTN. Similarly, transistor N2 will no longer be conducting so that node N need no longer source current Icp, stopping any further decreases in VCTP. The changes in VCTN and VCTP will be maintained until the next up/down pulse cycle.

For the current sources formed by transistor pairs N9/N11 and N10/N12 to operate, the voltage at the source of transistors N9 and N10 should remain above 2*Vdsat, the saturation voltage for transistors N9 through N12. Thus, neither VCTP nor VCTN should be pulled below 2*Vdsat to maintain proper operation. Because of the differential operation, this means that the maximum either voltage can attain is VCC−2*Vdsat. As described previously, a common-mode feedback loop 250 is provided to keep the VCTP and VCTN voltages biased properly with respect to the common mode voltage. Because voltages VCTP and VCTN should be complementary with respect to the common-mode voltage, if these voltages are impressed at either end of a resistor, the voltage at the mid-point of the resistor will equal the common-mode voltage. For example, consider the resistors R that are coupled in series within common-mode feedback loop 250 with respect to a node X. If voltages VCTP and VCTN are coupled to either end of this series combination, the voltage at node X should equal the common-mode voltage. The voltage at node X (denoted as fvcmv) is compared to the common-mode reference voltage VCM using a differential pair of NMOS transistors N13 and N14. However, coupling the voltages VCTN and VCTP directly to the series combination of resistors R would be problematic in that these voltages should be isolated from any possible low impedance points. Any unnecessary loading should be avoided in order to get high performance because the voltages VCTN and VCTP drive the dynamic operation of the differential PLL that will incorporate charge pump 200. In addition, the current through resistors R will change in a wide range because of the constant resistive values. Accordingly, voltages VCTP and VCTN should be isolated or buffered from common-mode feedback loop 250.

To provide this isolation, operation transconductance amplifiers (OTAs) 205 and 210 isolate VCTP and VCTN from resistors R. By driving complementary currents into resistors R, each OTA 205 and 210 operates to provide a buffered version of its control voltage. These buffered versions may be denoted as VCTP' and VCTN'. To allow these voltages to have the greatest potential range (2*Vdsat, VCC−2*Vdsat), operational transconductance amplifiers (OTAs) 205 and 210 may be rail-to-rail OTAs.

The operation of common-mode feedback loop 250 may be further explained as follows. A current source formed from NMOS transistors N16 and N15 biases a differential pair formed from NMOS transistors N13/N14. The gate of transistor N13 is coupled to node X whereas the gate of transistor N14 is biased by the common-mode reference voltage. Should the common-mode voltage at node X be too low compared to the reference common-mode voltage, the current provided to transistors N15/N16 will be largely provided by transistor N14. In turn, the increase in current through transistor N14 will cause a drop at the gate of a PMOS transistor P9. This gate voltage (denoted as pcomfb) drives the gates of PMOS transistors P6 and P3. The decrease in voltage pcomfb causes transistors P6 and P3 to conduct more current, thereby increasing the charge at nodes A and B. In turn, this increase in charge at nodes A and B causes voltages VCTP and VCTN to rise, thereby curing the deficiency in the common-mode voltage. An analogous and complementary operation occurs should the common-mode voltage be greater than the reference common-mode voltage. It will be appreciated that other common-mode feedback circuit topologies may be used.

Consider the advantage that flows from using rail-to-rail OTAs 205 and 210. The supply voltage VCC may be decreased to sub 1 V levels while still maintaining sufficient dynamic range in the positive and negative control voltages VCTP and VCTN. Note that the drains of P5 and P4 (or equivalently P3 and P6) could be pulled to ground through the coupling to the drains of N3 and N7, respectively. In turn, this would upset the balance between VCTP and VCTN, thereby causing jitter and other undesirable effects. To provide isolation, the drains of transistors N1, N2, N5, and N6 couple through resistors R1, R2, R3, and R4, respectively, to the drains of P5 and P4. In this fashion, the likelihood of jitter is further decreased.

The above-described embodiments of the present invention are merely meant to be illustrative and not limiting. It will thus be obvious to those skilled in the art that various changes and modifications may be made without departing from this invention in its broader aspects. Accordingly, the appended claims encompass all such changes and modifications as fall within the true spirit and scope of this invention.

We claim:

1. A differential charge pump, comprising:
   a current switch responsive to a pulse width difference between a differential up voltage and a differential down voltage to source and sink a current in a complementary fashion from a pair of differential output nodes, wherein the differential output nodes are voltage isolated from the current switch;
   a first transconductance amplifier configured to convert a voltage at a first one of the differential output nodes into a first current;
   a second transconductance amplifier configured to convert a voltage a second one of the differential output nodes into a second current that is complementary to the first current;
   a resistive load coupled between a first node and a second node, wherein the first transconductance amplifier is configured to couple the first current to the first node and the second transconductance amplifier is configured to couple the second current to the second node;
   a first differential pair of transistors biased by a first current source to conduct the current, the transistors in the first differential pair being responsive to the differential up voltage such that when the differential up voltage is pulsed the current is conducted by a first transistor in the first differential pair and when the differential up voltage is not pulsed the current is conducted by a remaining second transistor in the first differential pair;

a second differential pair of transistors biased by a second current source to conduct the current such when the differential down voltage is pulsed the current is conducted by a first transistor in the second differential pair and when the differential up voltaqe is not pulsed the current is conducted by a remaining second transistor in the second differential pair;

a first current source configured to source twice the current to a third node; and a second current source configured to source twice the current to a fourth node, wherein the first transistor in the first differential pair and the second transistor in the second differential pair couples to the third node through a first pair of resistors, and wherein the second transistor in the first differential pair and the first transistor in the second differential couples to the fourth node through a second pair of resistors, whereby the first and second pairs of resistors perform the voltage isolation of the current switch from the differential output nodes.

2. The charge pump of claim 1, wherein the first and second transistors in the first and second differential pairs are NMOS transistors.

3. A differential phase-locked loop (PLL), comprising:

a phase detector configured to compare a feedback signal to a reference signal to produce a differential up voltage and a differential down voltage; and a charge pump including a current switch responsive to a pulse width difference between the differential up voltage and the differential down voltage to source and sink a current in a complementary fashion from a pair of differential output nodes, wherein the differential output nodes are voltage isolated from the current switch, the charge pump including a common-mode feedback circuit configured so that the differential output nodes charge and discharge with respect to a common mode voltage, and wherein the common-mode feedback circuit is isolated from the differential output nodes through transconductance amplifiers;

wherein the charge pump includes a first differential pair of transistors biased by a first current source to conduct the current, the transistors in the first differential pair being responsive to the differential up voltage such that when the differential up voltage is pulsed the current is conducted by a first transistor in the first differential pair and when the differential up voltage is not pulsed the current is conducted by a remaining second transistor in the first differential pair; and a second differential pair of transistors biased by a second current source to conduct the current such when the differential down voltage is pulsed the current is conducted by a first transistor in the second differential pair and when the differential up voltage is not pulsed the current is conducted by a remaining second transistor in the second differential pair;

and wherein the common-mode feedback circuit includes a first current source configured to source twice the current to a first node; and a second current source configured to source twice the current to a second node, wherein the first transistor in the first differential pair and the second transistor in the second differential pair couples to the first node through a first pair of resistors, and wherein the second transistor in the first differential pair and the first transistor in the second differential couples to the second node through a second pair of resistors, whereby the first and second pairs of resistors perform the voltage isolation of the current switch from the differential output nodes.

4. The differential PLL of claim 3, wherein the transistors in the first and second differential pairs are NMOS transistors.

5. The differential PLL of claim 3, further comprising:

a loop filter configured to filter voltages at the differential output nodes to provide a filtered differential output voltage;

a voltage-controlled oscillator configured to provide an output signal having a frequency dependent upon the filtered differential output voltage; and a loop divider configured to divide the output signal to provide the feedback signal.

* * * * *